(12) United States Patent
Ammar

(10) Patent No.: US 7,599,977 B2
(45) Date of Patent: Oct. 6, 2009

(54) DIRECT DIGITAL SYNTHESIZER SYSTEM AND RELATED METHODS

(75) Inventor: Danny F. Ammar, Windermere, FL (US)

(73) Assignee: Reveal Imaging, LLC, Bedford, MA (US)

( * ) Notice: Subject to any disclaimer, the term of this patent is extended or adjusted under 35 U.S.C. 154(b) by 948 days.

(21) Appl. No.: 11/204,674

(22) Filed: Aug. 16, 2005

(65) Prior Publication Data
US 2007/0040615 A1   Feb. 22, 2007

(51) Int. Cl.
*G06F 1/02* (2006.01)
(52) U.S. Cl. ............................................ 708/271
(58) Field of Classification Search ............... 708/271
See application file for complete search history.

(56) References Cited

U.S. PATENT DOCUMENTS

| | | | |
|---|---|---|---|
| 4,951,237 A | 8/1990 | Essenwanger | |
| 5,291,428 A | 3/1994 | Twitchell et al. | |
| 5,886,752 A * | 3/1999 | Cross | 348/724 |
| 6,414,555 B2 | 7/2002 | Staszewski et al. | |
| 6,483,388 B2 * | 11/2002 | Khan | 331/18 |
| 6,522,176 B1 | 2/2003 | Davis | |
| 7,103,327 B2 * | 9/2006 | Pan | 455/102 |
| 2004/0210611 A1 | 10/2004 | Gradishar et al. | |
| 2005/0077935 A1 | 4/2005 | Giuroiu | |

* cited by examiner

*Primary Examiner*—Chuong D Ngo
(74) *Attorney, Agent, or Firm*—David F. Crosby; T. J. Clark; Mintz, Levin, Cohn, Ferris, Glovsky and Popeo, P.C.

(57) ABSTRACT

A direct digital synthesizer (DDS) has reduced spurious signals and includes a DDS core that produces a digital representation of a signal to be synthesized. A plurality of DDS circuits are operatively connected to the DDS core, each having a digital-to-analog converter connected to the DDS core for receiving the digital representation and converting it into a signal. A modulator is operatively connected to an oscillator circuit and digital-to-analog converter for receiving signals from the digital-to-analog converter and producing a modulated output signal. The individual frequencies of the respective DDS circuits are randomly and continuously changed from each other. A mixer receives and mixes the modulated output signals from the plurality of DDS circuits to create a mixed output signal at a selected and fixed frequency.

26 Claims, 5 Drawing Sheets

DIRECT DIGITAL SYNTHESIZER SYSTEM AND RELATED METHODS

FIELD OF THE INVENTION

This application relates to a direct digital synthesizer (DDS), and more particularly, to a direct digital synthesizer that suppresses spurs.

BACKGROUND OF THE INVENTION

Many of today's communications and radar systems call for RF synthesizer performance, which often is difficult to implement using direct frequency multiplication, phase-locked-loop (PLL) or direct digital synthesizer (DDS) alone. To achieve a desired frequency range, a high frequency output, a fine tuning resolution, a fast settling time, and a low phase noise, system designers often combine PLL and DDS technologies. The strengths of one technology join with the strengths of the other technology to extend the possible range of performance.

DDS provides advantages that are difficult or expensive to achieve using other frequency synthesis systems. These advantages include fast switching (typically sub-microsecond), which is important in spread-spectrum or frequency-hopping systems, including radar and communication systems. Similar systems typically cannot change frequencies as rapidly as a DDS. Additional advantages of a DDS system include fine tuning steps, excellent phase noise, transient-free (phase continuous) frequency changes, flexibility as a modulator, and small size, among others.

There are some disadvantages to common DDS systems, however, imposing some restrictions on the designer. A DDS system covers an operating range limited by the Shannon, Nyquist sampling theory. The output is typically limited to about 45% of the maximum clock rate at which the logic can be operated. The broadest bandwidth DDS system typically has been clocked at somewhat over 1 GHz, with an output bandwidth of about 450 MHz. Another limitation is spectral purity, which is governed by the density/complexity of the logic circuitry that is attainable at the desired operating speed. Spectral purity and operating bandwidth are typically inversely correlated. Despite these limitations, DDS is an important tool in many applications, and some of its functional capabilities are not attainable with most other signal generation techniques.

Figure 1:
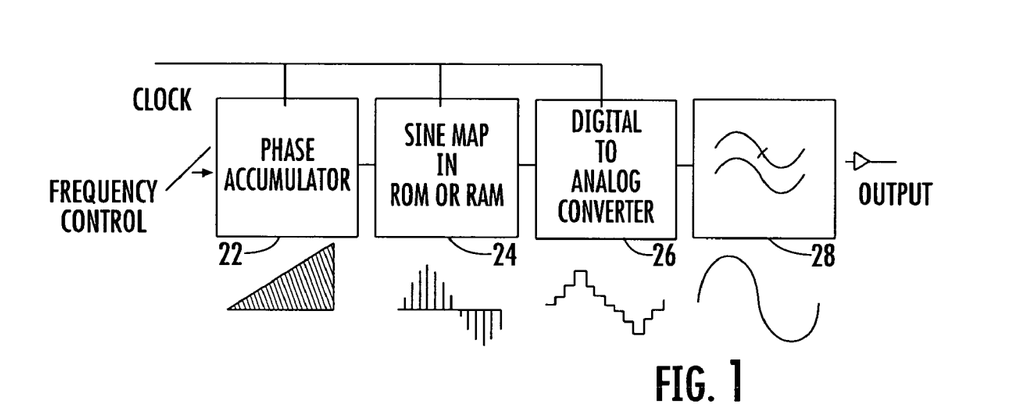
FIG. 1 is a block diagram of a conventional DDS system.

There are many variations of a conventional DDS system, one example being shown in FIG. 1 at 20. A conventional DDS system 20 typically includes a phase accumulator 22, a mapping circuit 24, and a digital-to-analog (D/A) converter 26. The signal after D/A conversion is typically filtered within a filtering circuit 28 and output. Frequency control is applied to the phase accumulator 22, and a clock signal applied to the phase accumulator 22, mapping circuit 24 and D/A converter 26. The mapping circuit 24 includes a sine map and can be formed in Random Access or Read only memory. A representation of the processed signal is shown below each functional component 22, 24, 26 and 28.

The ability to produce efficiently and economically fine frequency steps enables the DDS to replace multiple loops in many PLL designs. The resulting PLL and DDS architecture covers its range in fine steps, while retaining reasonable division ratios, thus preserving phase noise. In some cases, designers do not accept the cost and complexity of multiple loop synthesizers when similar performance can be achieved by adding a DDS.

There are several fundamental techniques by which a DDS can be combined with a PLL. In simple applications where only multiplication is sought (and spectral purity is not critical), the output of the DDS can be injected directly into a phase comparator. When spectral purity is important, however, a combining loop can be added. Even when using two loops, the resulting circuitry is typically less complex than would be required in a conventional system using only a PLL circuit if the same combination of phase noise and step size is required.

Figure 2:
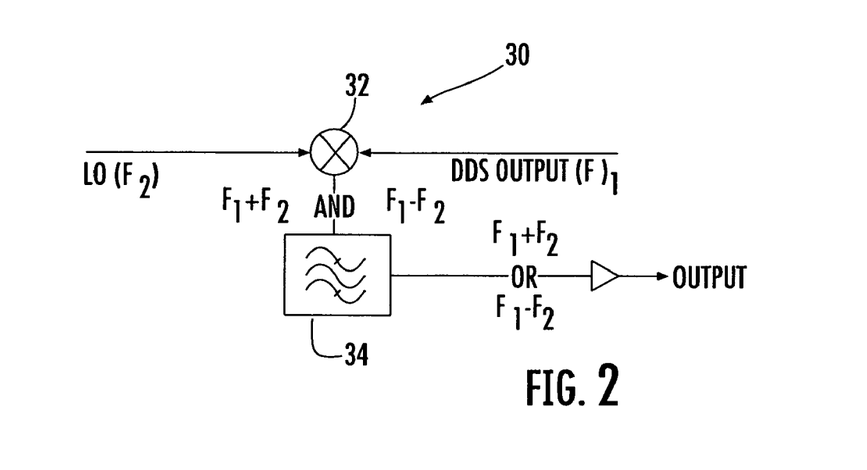
FIG. 2 is a block diagram of a conventional up-conversion frequency synthesizer.

Some DDS systems use up-conversion circuits, which integrate a mix/filter/divide (direct-analog) synthesizer circuit, for example, as shown in FIG. 2 at 30. This type of system often permits 60-70% of the output from the DDS to be translated to a new frequency range. A filter is often added to determine its limit. Usually two sidebands must be sufficiently distant to permit the filter to select a sideband. The circuit 30 as illustrated, includes a mixer 32 and filter 34 as operative with other components in a divide circuit function.

DDS synthesizers as described have been used in many applications, including radios, instrumentation, and radar systems. Though large and unpredictable spurious emissions or responses, also referred to as spurs, have troubled some prior art designs, recent innovations have improved DDS performance, and typically, worst-case spurs are made smaller and more predictable.

Even with recent technological improvements in DDS systems, there are typically four principal spur sources: 1) the reference clock, 2) truncation in the phase accumulator, 3) angle-to-amplitude mapping errors, and 4) DAC error terms, including non-linearities and quantization noise. Spurs can sometimes be created by other source but these four sources are often more problematic. In narrow tuning applications, however, the spur frequencies' predictability allows a designer to develop an effective frequency plan. In wide tuning applications, however, it is difficult to devise a frequency plan that avoids spurs.

SUMMARY OF THE INVENTION

In view of the foregoing background, it is therefore an object of the present invention to provide a direct digital synthesizer operative in wide tuning applications and avoids spurs.

In accordance with one aspect, a direct digital synthesizer (DDS) has reduced spurious signals and includes a DDS core that produces a digital representation of a signal to be synthesized. A plurality of DDS circuits are operatively connected to the DDS core, each having a digital-to-analog converter connected to the DDS core for receiving the digital representation and converting it into a signal. A modulator is operatively connected to an oscillator circuit and the digital-to-analog converter for receiving signals from the digital-to-analog converter and producing a modulated output signal wherein individual frequencies of the respective DDS circuits are randomly and continuously changed from each other. A mixer receives and mixes the modulated output signals from the plurality of DDS circuits to create a mixed output signal at a selected and fixed frequency.

In one aspect, the mixer is operative for summing the modulated output signals without multiplication or frequency gain. The sum of frequencies within the mixer of the modulated output signals is typically constant and the modulated output signals typically have frequencies that vary randomly. A bandpass filter receives the mixed output signal for selecting a desired frequency for filtering wideband noise. A multiplier circuit receives a signal from the bandpass filter and increases spur levels on an instantaneous basis. The bandpass filter receives a multiplied signal from the multiplier circuit. The DDS core can be formed as a field programmable gate array. The oscillator circuit can be formed as a voltage controlled oscillator and phase-locked loop circuit.

In another aspect, first and second DDS circuits are operatively connected to the DDS core, each having a digital-to-analog converter connected to the DDS core for receiving the digital representation and converting it into a signal. A modulator is operatively connected to the digital-to-analog converter and respective first and second voltage controlled oscillator/phase-locked loop circuits for receiving signals from the digital-to-analog converter and producing a modulated output signal. A switched circuit can be operative with the first and second voltage controlled oscillator/phase-locked loop circuits for switching between the modulators within respective first and second DDS circuits. A hybrid circuit can be operative with the switched circuit, in yet another aspect.

A method aspect comprises the step of forming a digital representation of a signal within a direct digital synthesizer (DDS) core. The digital representation is converted into a signal within a plurality of DDS circuits. Each has a digital-to-analog converter connected to the DDS core for receiving the digital representation and converting it into a signal. A modulator is operatively connected to the digital-to-analog converter and receives signals from the digital-to-analog converter. An oscillator circuit produces aimodulated output signal and mixes each modulated output signal to create a mixed output signal at a selected frequency.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The DDS synthesizer of the present application uses frequency dither that suppresses spurs by breaking up the regularity of the output spectrum with randomization. Any line spectrum associated with the spurs is impressed on the final output waveform and results in spectral lines in the synthesizer output spectrum. This can be suppressed by breaking up the regularity of the output spectrum with randomization as frequency dither. In one non-limiting example, the system incorporates a phase-locked-loop (PLL) circuit and direct digital synthesizer (DSS) circuit to achieve fast frequency hopping and wide frequency tuning, while adding frequency dither to break-up the regularity of the output spectrum. Independent DDS synthesizers are mixed together. In this embodiment, a mixer sums the output of two DDS synthesizers without multiplication or frequency gain, preserving the phase noise and spur performance of each of the individual DDS synthesizers. A bandpass filter after the mixer selects a desired frequency and is operative to suppress wide-band noise.

A technical description of various DDS functions and problems associated with major spur sources such as the reference clock, truncation in the phase accumulator, angled-to-amplitude mapping errors and digital-to-analog error terms, including non-linearites and quantization noise are first explained, followed by a description of the system in accordance with one example of the present invention.

It should be understood that some DDS circuits function similar to a high-resolution frequency divider having a reference clock as its input and a digital-to-analog converter as its output. Typically, spectral characteristics of the reference clock can impact the output. When phase noise and spurs on the reference clock appear at the DAC output, they usually have a higher magnitude because of frequency multiplication. The degradation, usually expressed in decibels, is about $20 \log(N)$, where N is the ratio of input to output frequencies. For example, when a 120 MHz clock is used (internally multiplied up by 4 in the DDS circuit) to generate a 120 MHz, usually no difference in phase-noise results. The internal reference-clock path from the DDS is a contributor of phase noise from the DDS.

The quality of the reference clock often imposes recognizable limits on DDS performance. For example, a reference clock can cause DDS spurs that maintain their relationship to the carrier as the system changes its output frequency. Also, there is some degree of noise at the input. A high-slew-rate reference clock, however, spends less time traversing the region where noise can cause jitter. Therefore, circuit designers usually select a high quality reference clock.

Examples of typical phase noise and spur performance for many commercially available 100 MHz reference clocks are as follows:

| Frequency Offset | Phase Noise |
| --- | --- |
| 100 Hz | −130 dBc/Hz |
| 1 kHz | −150 dBc/Hz |
| 10 kHz | −174 dBc/Hz |
| 20 kHz | −174 dBc/Hz |
| Spur Level | <120 dBc |

The effect of phase transaction and amplitude mapping is best understood through explanation of the operation of a DDS. Commonly used methods for reducing DDS generated spurs include phase dither and Taylor Series correction.

Figure 3:
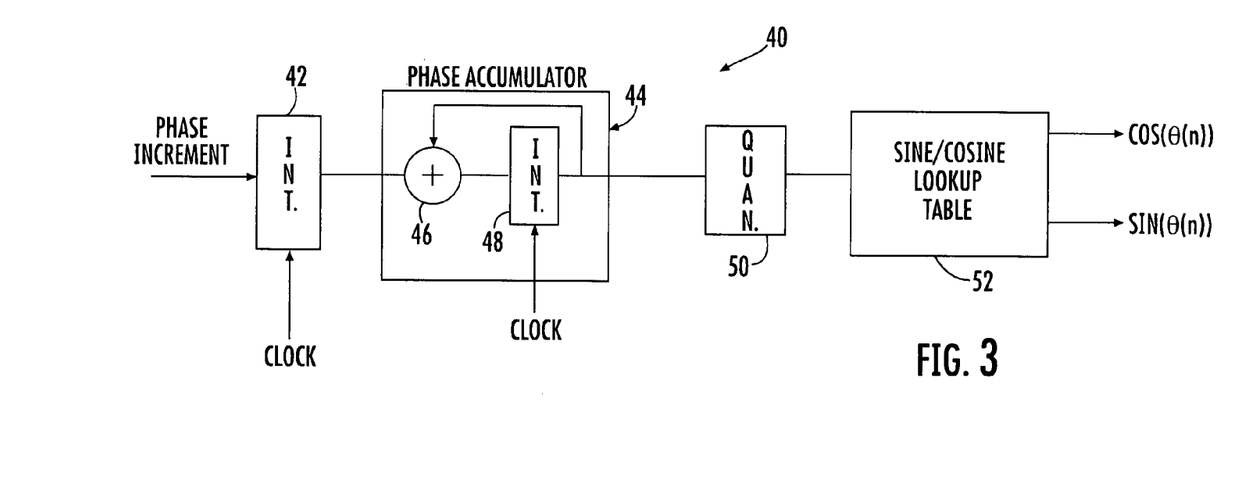
FIG. 3 is a block diagram of a phase truncated DDS core.

FIG. 3 is a block diagram of a conventional DDS core 40, in this example formed as a phase truncated DDS core. A phase increment signal is received at an integrator 42, which also receives a reference clock signal, and input into a phase accumulator 44 having summer and integrator circuits 46 and 48. After phase accumulation, the signal is quantized in a quantizer circuit 50. The integrator computes a phase slope that is mapped to a sinusoid by the sine/cosine look-up table 52. The quantizer 50 accepts the high precision phase angle θ (n) and generates a lower precision representation of the angle. This value is presented to the address port of the look-up table that performs the mapping from phase to time.

The fidelity of a signal formed by recalling samples of a sinusoid from a look-up table is affected by both the phase and amplitude quantization. The length and width of the look-up table affect the phase angle and amplitude resolution of the signal. These resolution limits are typically about equivalent to a time based jitter and amplitude quantization of the signal, and therefore result in spectral modulation lines and add white, broad-band noise floor to the signal spectrum.

Figure 4:
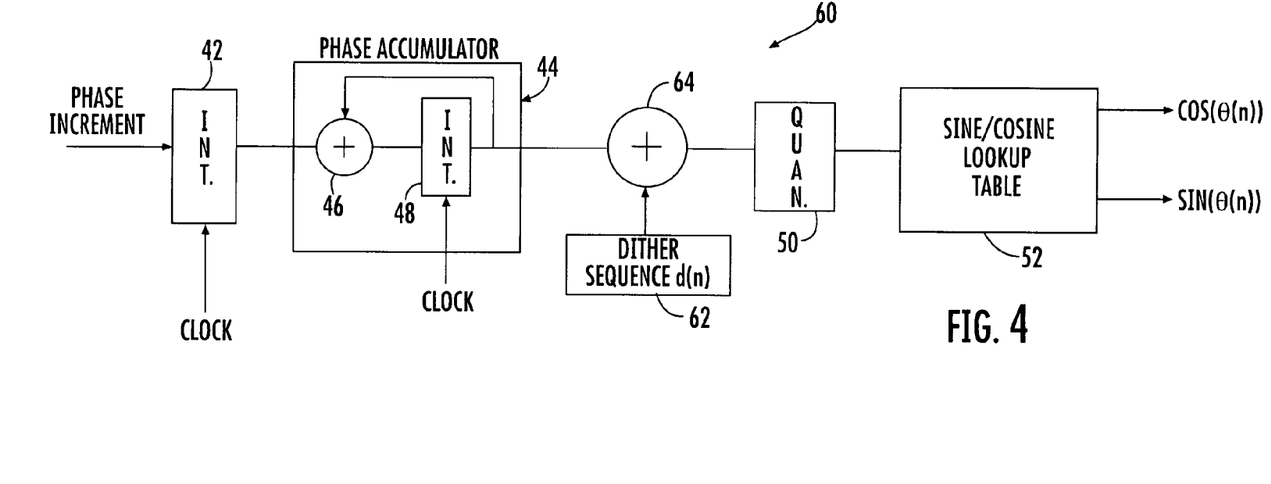
FIG. 4 is a block diagram of a phase dithered DDS core.

In the phase truncated DDS 60 shown in FIG. 4, a dither sequence circuit 62 inputs a signal to a summer 64, which receives the output from the phase accumulator 44, forming a phase dithered DDS core. The quantizer 50 receives the signal from summer 64 introducing phase error into the phase slope by discarding the least significant part, a fractional component of the high precision phase accumulator. The phase error due to the discarded fractional part of the address count is periodically serious enough to result in undesired spectral line structure, which can sometimes be suppressed by breaking up the regularity of the address error with an additive randomizing signal. This randomizing sequence called dither, is typically a noise sequence, with a variance approximately equal to the least significant integer bit of the phase accumulator. The dithered DDS 60, as described, supplies approximately an additional 12 dB of spurious free dynamic range (SFDR) in comparison to a phase-truncated design.

The phase dithered DDS, and phase truncated DDS include a quantizer, which produces a lower precision by discarding the fractional component of the high precision phase. A quantization step maintains the size of the lookup memory to a reasonable size. The trade-off is spectral purity. With the availability of embedded multipliers in field programmable gate arrays (FPGA's), for example, a field programmable gate array from Xilinx of San Jose, Calif., it is now practical to use the previously discarded fractional bits to calculate the corrections that can be added to look-up table values, producing an output signal with very high spurious free dynamic range.

Figure 5:
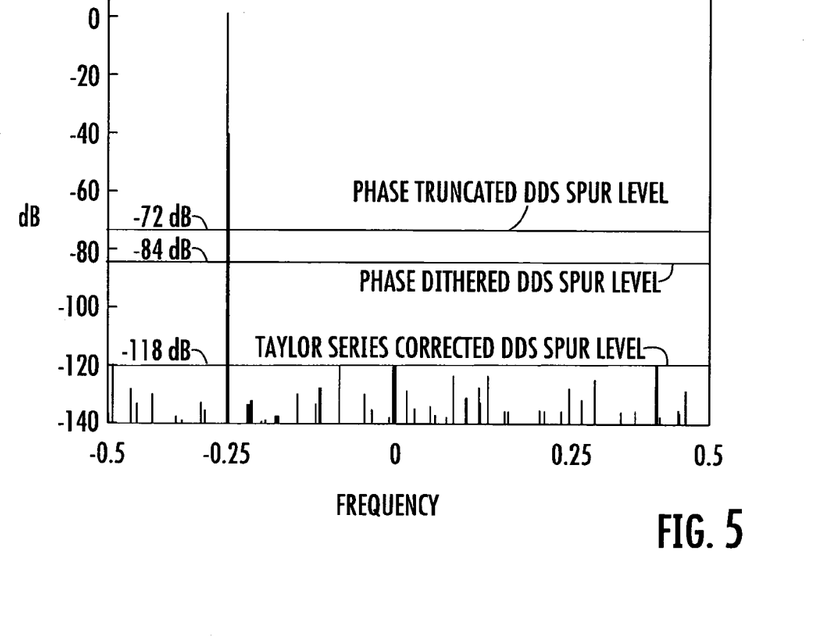
FIG. 5 is a graph showing a Taylor Series corrected DDS.

FIG. 5 shows a graph of an example of a Taylor series corrected DDS. The spurs are reduced to about 118 dB below the output signal in this example. Using this same configuration, a phase truncated DDS could possibly produce peak spurs at about 72 dB below the output signal. A phase dithered DDS could produce peak spurs at about 84 dBc.

In these types of circuits, the quantization noise and distortion in the digital-to-analog converter determine its signal-to-noise ratio (SNR). A first-order approximation of SNR is usually the ratio between the quantization-noise power, integrated over the Nyquist bandwidth, and the power in the fundamental. As a result, SNR can be proportional to the DAC resolution in bits. For example: SNR=6.02 N+1.76 (dB), where N is the DAC resolution in bits.

This SNR calculation describes an ideal digital-to-analog converter. Real digital-to-analog converters, however, typically have nonlinearities due to process mismatches and imperfect bit-weight scaling. Non-ideal switching characteristics also add distortion and nonlinearity.

The most prominent digital-to-analog converter spurs usually result from non-ideal switching characteristics, which, along with any nonlinearity in the transfer function, appear as lower order harmonics of the fundamental. Both quantization noise and any non-ideal digital-to-analog converter properties produce a response that has harmonically related spurs of the fundamental. This relationship can be used to predict the frequency location of prominent spurs.

Figure 6:
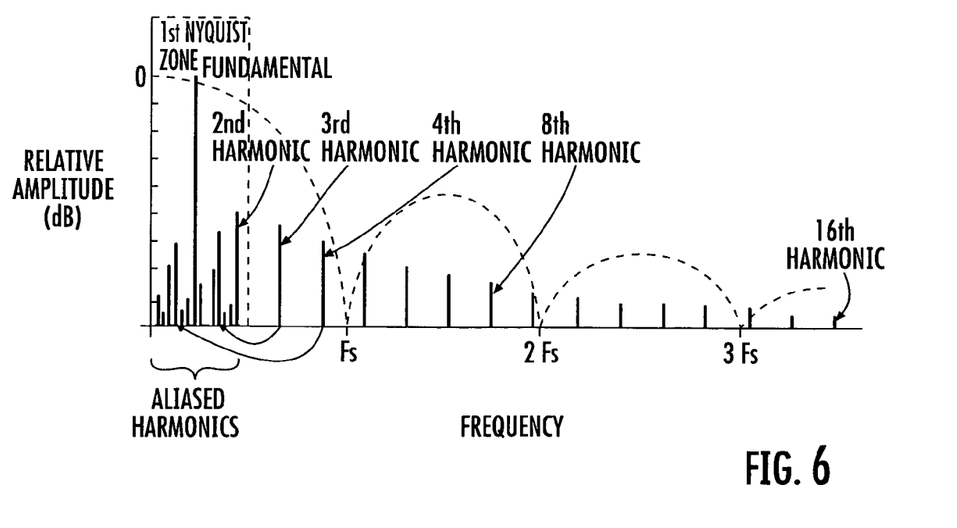
FIG. 6 is a graph showing digital-to-analog converter with harmonic aliasing as used in some DDS systems.

Harmonics are typically aliased because the digital-to-analog converter is a time-sampled system. As a result, the carrier's harmonics, the reference clock, and the reference clock's harmonics create numerous sum and difference-mixing products. The well-defined mathematical relationship of these products, however, makes predicting the spur locations possible. Harmonics beyond the first Nyquist zone are mapped back to the first Nyquist zone as shown in FIG. 6, illustrating the digital-to-analog converter harmonic aliasing and showing relative amplitude and frequency.

Figure 7:
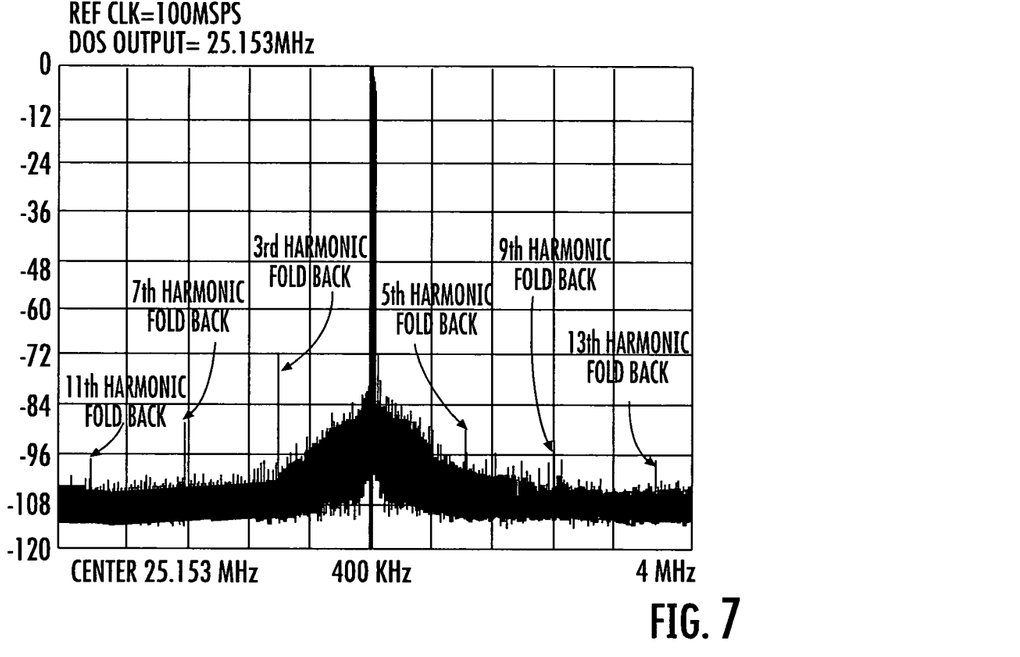
FIG. 7 is a graph showing digital-to-analog converter spurs.
Figure 8:
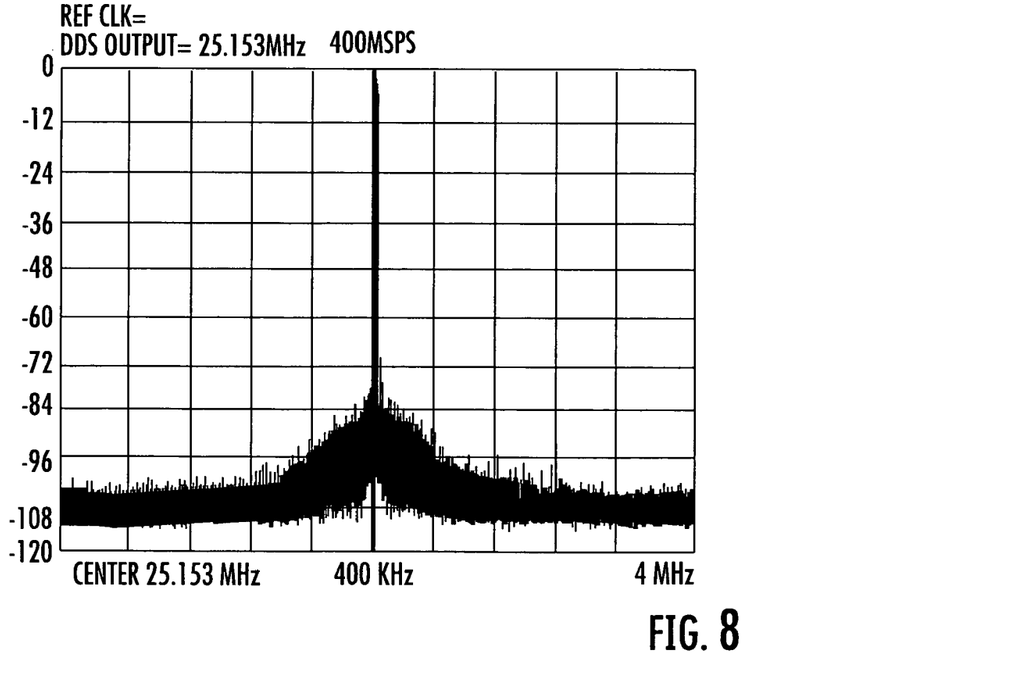
FIG. 8 is a graph showing the effects of over-sampling on digital-to-analog converter spurs.

For example, a digital-to-analog converter tuned to 25.153 MHz with a reference clock of 100M samples/second generates low-order odd harmonics close to the fundamental, for example, as shown in the graph of FIG. 7. Once the harmonic series exceeds the Nyquist frequency, the series aliases back into the first Nyquist zone in a predictable way as a difference product. In this example, the digital-to-analog converter has a 14-bit DAC. The SFDR (spurious-free dynamic range) within the 4-MHz bandwidth is better than −73 dBc. Increased oversampling by raising $f_{REF}$ to 400M samples/sec eliminates the alias products of the third, fifth, and seventh harmonics within the first Nyquist zone as shown in the example graph of FIG. 8.

One current state of the art digital-to-analog converter is a MAX5895 DAC, made by Maxim/Dallas Corporation. This type of chip is representative of a state of the art in digital-to-analog converter in speed and number of bits. The MAX5895 is a programmable interpolating, modulating, 500 Msps dual digital-to-analog converter. The device integrates a selectable 2×/4×/8× interpolating filter, a digital quadrature modulator, and dual 16-bit high-speed digital-to-analog converter on a single integrated circuit. At 50 MHz output frequency, a 4× interpolation, and 125 Msps update rate, the in-band (DC to $f_{data}/2$) SFDR is 90 dBc. The theoretical SNR of a 16-bit digital-to-analog converter is typically about 98 dBc.

As noted before, a requirement in many RF synthesis systems is to achieve and maintain low phase noise and low spurs. The many contributors to phase noise and spurs should be minimized if maximum system performance is to be achieved. Phase noise and spurs, no matter how low in the primary frequency component, grow with increasing frequency multiplication or with PLL frequency gain in a complete synthesizer.

Figure 9:
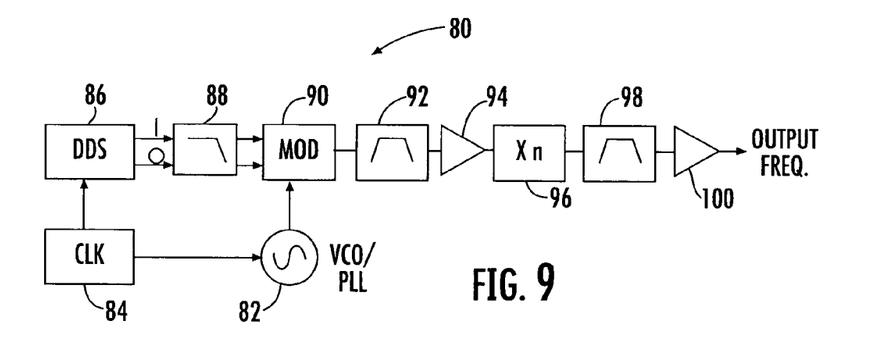
FIG. 9 is a block diagram showing a conventional DDS synthesizer.

There are various techniques used to combine a PLL and DDS to produce a radio frequency (RF) synthesizer that can be adapted from various uses. The RF synthesizer 80 shown in FIG. 9 represents a combination PLL and DDS design. In this design, the voltage controlled oscillator/phase locked loop circuit 82 (VCO/PLL), is locked to the reference clock 84. The VCO/PLL 82 generates a fixed (or tunable) output in the 1 to 3 GHz range in this example. The DDS circuit 86, which is also locked to the reference clock 84, tunes over a few MHz in small steps and at a fast settling time. The low pass filter 88 after the DDS reconstructs the DDS time sampled sine wave output.

The modulator 90 receives the low pass filtered signal, and the signal from the VCO/PLL 82. The modulated signal passes through a bandpass filter 92, amplifier 94, Xn circuit 96 as a multiplier, bandpass filter 98, amplifier 100 and is output.

Although this type of design allows fast frequency hopping and wide frequency tuning, the resulting spurs could be unacceptable. As was presented in the previous section, even when using state of the art circuits and designs in a DDS FPGA core and high speed/high resolution digital-to-analog converter, the resulting spurs are at −90 dBc at the output of the DDS. This spur level would be acceptable for some low frequency applications, but if the DDS output is multiplied up, the spur level will be increased by 20 log (n), where n is a multiplication number. For example, if the VCO frequency is at 2 GHz and the DDS frequency is at 60 MHz, the output of the modulator 90 will be at about 2.06 GHz in this example. If this synthesizer 80 is used for ka-band (33 GHz) radar applications, the multiplication number will be about 16. In this application, the spur level will increase by about 24 dB, resulting in about −66 dBc spur level in some best cases. This spur level may not be sufficient for applications where −80 dBc is required.

Typically, the line spectrum associated with the spurs is impressed on the final output waveform and results in spectral lines in the synthesizer output spectrum. This structure can be suppressed by breaking up the regularity of the output spectrum with randomization, also referred to as frequency dither.

Figure 10:
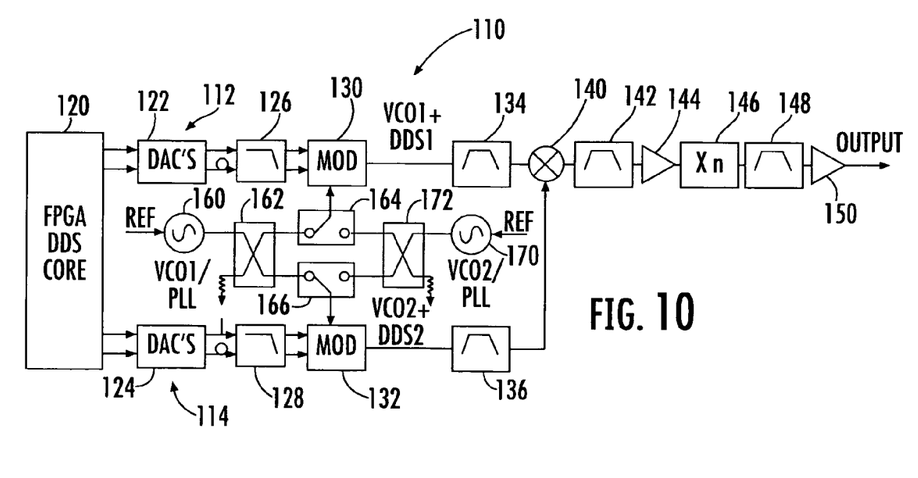
FIG. 10 is a block diagram showing a frequency dithered DDS synthesizer in accordance with one example of the present invention.

In accordance with one embodiment of the invention, a PLL and DSS combination achieves fast frequency hopping and wide frequency tuning, and adds frequency dither to break-up the regularity of the output spectrum. FIG. 10 is an example circuit of a frequency synthesizer 110 using dither in accordance with one embodiment.

The frequency dither DDS synthesizer 110 shown in FIG. 10 incorporates two independent DDS synthesizer circuits 112 and 114 that are mixed together. As illustrated, a field programmable gate array (FPGA) DDS core 120 is operative with the first DDS synthesizer circuit 112 and the second DDS synthesizer circuit 114. Each respective DDS circuit 112 and 114 includes a digital-to-analog converter 122 and 124, a low pass filter 126 and 128, a modulator 130 and 132 and bandpass filter 134 and 136. The outputs from the bandpass filters 134 and 136 are mixed within the mixer 140, and a mixer output signal passes through a bandpass filter 142, amplifier 144, Xn circuit 146, bandpass filter 148, amplifier 150 followed by output. A first voltage controlled oscillator/phase locked loop circuit(VCO1/PLL) 160 is operative with a first hybrid circuit 162 and first and second switches 164 and 166. A second voltage controlled oscillator/phase locked loop circuit (VCO2/PLL) 170 is operative with a second hybrid circuit 172 and the two switches 164 and 166. The two switches switch between the hybrids 164 and 166 and into their respective modulators 130 and 132 of the first DDS synthesizer circuit and the second DDS synthesizer circuit.

In operation, the signals from the first and second DDS synthesizer circuits 112 and 114 are mixed together to create the desired frequency F=(VCO1+DDS1)+(VCO2+DD2). For any given output frequency, the sum of the two DDS frequencies will remain constant, but the individual DDS frequencies can vary randomly ($f=f_{dds1}+f_{dds2}$). For example, if the sum of the frequencies is 100 MHz, $f_{dds1}$ can be any value between 20 and 80 MHz and $f_{dds2}=(100-f_{dds1})$.

The location of the spurs is typically continuously randomized resulting in no noticeable increase in spur level at the output of sum of the two (VCO+DDS) frequencies.

The mixer 140 sums the output of the first and second DDS synthesizer circuits 112 and 114 without multiplication or frequency gain, preserving the phase noise and spur performance of each of the individual DDS synthesizers. The bandpass filter 142 following the mixer 140 selects a desired frequency, and filters the wideband noise that may be present at that point. For high frequency applications, the output of the filter 142 is multiplied by "n" within the Xn circuit 146 and the spur level typically will increase by 20 log (n), but only on an instantaneous basis as single pulse. In many radar applications, the waveform uses multiple pulses for target detection tracking or mapping. The DDS frequency dither randomizes the location of the DAC spurs from pulse to pulse.

By processing multiple coherent pulses, the SFDR can be improved to approximately the SNR value. As the spurs are randomized, their energy is spread over a wide band resulting in a slight increase (about 1 to 3 dB, for example) in noise level. As a non-limiting example, if a radar uses a 64-point Fast Fousier Transform (FFT) to detect the target, the spur will be randomized and the noise level will increase slightly. Using the MAX5895 DAC's, for example, the expected SNR could decrease from about 98 dBc to about 95 dBc with spur randomization. In addition, because radar Pulse Repetition Frequencies (PRF) are typically only a few hundred KHz, even a small DDS frequency dither (a few MHz) can result in significant spur randomization.

To achieve phase noise performance with this synthesizer architecture, the Voltage Controlled Oscillators (VCO's) are implemented as fixed frequency PLL loops, which can be optimized for phase noise within the loop bandwidth by a loop filter and outside the loop bandwidth by careful choice of the VCO. The PLL loop can be implemented using an analog phase detector, versus using a digital PLL chip. Whereas the analog PLL can provide well over 165 dB phase detector floor, the digital PLL chips are usually limited to about 145 dB floor which affects the close in phase noise level.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A direct digital synthesizer (DDS) having reduced spurious signals comprising:
   a DDS core that produces a digital representation of a signal to be synthesized;
   an oscillator circuit;
   a plurality of DDS circuits operatively connected to the DDS core, each having a digital-to-analog converter connected to the DDS core for receiving the digital representation and converting it into a signal and a modulator operatively connected to said oscillator circuit and digital-to-analog converter for receiving signals from the digital-to-analog converter and producing a modulated output signal, wherein individual frequencies of the respective DDS circuits are randomly and continuously changed from each other; and
   a mixer that receives and mixes the modulated output signals from said plurality of DDS circuits to create a mixed output signal at a selected and fixed frequency.

2. A direct digital synthesizer according to claim 1, wherein said plurality of DDS circuits comprise first and second DDS circuits.

3. A direct digital synthesizer according to claim 1, wherein said mixer is operative for summing the modulated output signals without multiplication or frequency gain.

4. A direct digital synthesizer according to claim 1, wherein the sum of frequencies at the mixer of the modulated output signals is constant.

5. A direct digital synthesizer according to claim 1, wherein the modulated output signals have frequencies that vary randomly.

6. A direct digital synthesizer according to claim 1, and further comprising a bandpass filter that receives the mixed output signal for selecting a desired frequency and filtering wideband noise.

7. A direct digital synthesizer according to claim 6, and further comprising a multiplier circuit that receives a signal from the bandpass filter that increases spur level on an instantaneous basis.

8. A direct digital synthesizer according to claim 7, and further comprising a bandpass filter that receives a multiplied signal from the multiplier circuit.

9. A direct digital synthesizer according to claim 1, wherein the DDS core comprises a field programmable gate array.

10. A direct digital synthesizer according to claim 1, wherein said oscillator circuit comprises a voltage controlled oscillator and phase-locked loop circuit.

11. A direct digital synthesizer (DDS) having reduced spurious signals comprising:
a DDS core that produces a digital representation of a signal to be synthesized;
first and second voltage controlled oscillator/phase-locked loop circuits;
first and second DDS circuits operatively connected to the DDS core, each having a digital-to-analog converter connected to the DDS core for receiving the digital representation and converting it into a signal and a modulator operatively connected to said digital-to-analog converter and respective first and second voltage controlled oscillator/phase-locked loop circuits for receiving signals from the digital-to-analog converter and producing a modulated output signal, wherein individual frequencies of the first and second DDS circuits are randomly and continuously changed from each other; and
a mixer that receives and mixes the modulated output signals from said first and second DDS circuits to create a mixed output signal at a selected and fixed frequency.

12. A direct digital synthesizer according to claim 11, and further comprising a switch circuit operative with said first and second voltage controlled oscillator/phase-locked loop circuits for switching between the modulators within respective first and second DDS circuits.

13. A direct digital synthesizer according to claim 12, and further comprising a hybrid circuit operative with said switch circuit.

14. A direct digital synthesizer according to claim 11, wherein said mixer is operative for summing the modulated output signals without multiplication or frequency gain.

15. A direct digital synthesizer according to claim 11, wherein the sum of frequencies within the mixer of the modulated output signals is constant.

16. A direct digital synthesizer according to claim 11, wherein the modulated output signals have frequencies that vary randomly.

17. A direct digital synthesizer according to claim 11, and further comprising a bandpass filter that receives the mixed output signal for selecting a desired frequency and filtering wideband noise.

18. A direct digital synthesizer according to claim 17, and further comprising a multiplier circuit that receives a signal from the bandpass filter that increases spur level on an instantaneous basis.

19. A direct digital synthesizer according to claim 18, and further comprising a bandpass filter that receives a multiplied signal from the multiplier circuit.

20. A direct digital synthesizer according to claim 11, wherein the DDS core comprises a field programmable gate array.

21. A method for synthesizing a signal, which comprises:
forming a digital representation of a signal within a direct digital synthesizer (DDS) core;
converting the digital representation into a signal within a plurality of DDS circuits, each having a digital-to-analog converter connected to the DDS core for receiving the digital representation and converting it into a signal and a modulator operatively connected to said digital-to-analog converter for receiving signals from the digital-to-analog converter and an oscillator circuit and producing a modulated output signal, wherein individual frequencies of the respective DDS circuits are randomly and continuously changed form each other; and
mixing each modulated output signal to create a mixed output signal at a selected and fixed frequency.

22. A method according to claim 21, which further comprises converting the digital representation within first and second DDS circuits and modulating the converted signal within modulators operatively connected to first and second voltage controlled oscillator/phase-locked loop circuits and producing a modulated output signal.

23. A method according to claim 22, which further comprises switching between the first and second voltage controlled oscillator/phase-locked loop circuits and a modulator.

24. A method according to claim 21, which further comprises summing the modulated output signals without multiplication or frequency gain.

25. A method according to claim 21, which further comprises filtering the mixed output signals for selecting a desired frequency and filtering wideband noise.

26. A method according to claim 21, which further comprises multiplying the signal to increase spur levels on an instantaneous basis.

* * * * *

UNITED STATES PATENT AND TRADEMARK OFFICE
CERTIFICATE OF CORRECTION

PATENT NO. : 7,599,977 B2
APPLICATION NO. : 11/204674
DATED : October 6, 2009
INVENTOR(S) : Ammar It is certified that error appears in the above-identified patent and that said Letters Patent is hereby corrected as shown below:

On the Title Page,

Item [*] Notice: Subject to any disclaimer, the term of this patent is extended or adjusted under 35 USC 154(b) by 948 days Delete the phrase "by 948 days" and insert -- by 1,086 days --

Signed and Sealed this

Eleventh Day of May, 2010

David J. Kappos
*Director of the United States Patent and Trademark Office*

UNITED STATES PATENT AND TRADEMARK OFFICE
CERTIFICATE OF CORRECTION

PATENT NO. : 7,599,977 B2 Page 1 of 1
APPLICATION NO. : 11/204674
DATED : October 6, 2009
INVENTOR(S) : Danny F. Ammar It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1224 days.

Signed and Sealed this

Twenty-eighth Day of September, 2010

David J. Kappos
*Director of the United States Patent and Trademark Office*